(12) United States Patent
Ham et al.

(10) Patent No.: US 9,564,888 B2
(45) Date of Patent: Feb. 7, 2017

(54) VOLTAGE GENERATION APPARATUS

(71) Applicant: SK hynix Inc., Icheon-si Gyeonggi-do (KR)

(72) Inventors: Hyun Ju Ham, Seongnam-si (KR); Kee Teok Park, Seoul (KR); Hyung Sik Won, Cheongju-si (KR)

(73) Assignee: SK HYNIX INC., Icheon-si (KR)

( * ) Notice: Subject to any disclaimer, the term of this patent is extended or adjusted under 35 U.S.C. 154(b) by 113 days.

(21) Appl. No.: 14/710,253

(22) Filed: May 12, 2015

(65) Prior Publication Data

US 2016/0164513 A1 Jun. 9, 2016

(30) Foreign Application Priority Data

Dec. 9, 2014 (KR) .......................... 10-2014-0175970

(51) Int. Cl.
| | | |
|---|---|---|
| *G05F 3/02* | (2006.01) | |
| *H03K 17/22* | (2006.01) | |
| *G05F 1/46* | (2006.01) | |
| *G05F 3/16* | (2006.01) | |
| *G05F 1/56* | (2006.01) | |
| *G05F 1/575* | (2006.01) | |

(52) U.S. Cl.
CPC ............... *H03K 17/223* (2013.01); *G05F 1/46* (2013.01); *G05F 1/465* (2013.01); *G05F 1/56* (2013.01); *G05F 1/562* (2013.01); *G05F 1/575* (2013.01); *G05F 3/02* (2013.01); *G05F 3/16* (2013.01)

(58) Field of Classification Search
None
See application file for complete search history.

(56) References Cited

U.S. PATENT DOCUMENTS

| 6,836,104 B2 * | 12/2004 | Yoshihara | ............... G05F 1/465 323/314 |
| 9,323,260 B2 * | 4/2016 | Kim | ........................ G05F 1/465 |
| 2002/0089370 A1 * | 7/2002 | Shin | ........................ G05F 1/465 327/536 |
| 2008/0012543 A1 * | 1/2008 | Negoro | ..................... G05F 1/46 323/272 |

(Continued)

FOREIGN PATENT DOCUMENTS

| KR | 1020060030652 A | 4/2006 |
| KR | 101005136 B1 | 1/2011 |

*Primary Examiner* — Tuan T Lam
(74) *Attorney, Agent, or Firm* — William Park & Associates Ltd.

(57) ABSTRACT

A voltage generation apparatus may include an external voltage sensing circuit configured to generate a first start signal and a second start signal by sensing the magnitude of a first external voltage and the magnitude of a second external voltage. The voltage generation apparatus may include an internal voltage sensing circuit configured to generate a voltage generation signal by comparing an internal voltage with a target voltage. The voltage generation apparatus may include a voltage pumping circuit configured to be activated in response to the first start signal, configured to perform a pumping operation based on the voltage generation signal, and configured to generate the internal voltage. The voltage generation apparatus may include a voltage regulating circuit configured to be activated in response to the first and second start signals, and configured to generate the internal voltage based on the voltage generation signal.

16 Claims, 13 Drawing Sheets

(56) References Cited

U.S. PATENT DOCUMENTS

| | | | |
|---|---|---|---|
| 2008/0042730 A1* | 2/2008 | Kang | G05F 1/465 |
| | | | 327/536 |
| 2010/0164607 A1* | 7/2010 | Miyatake | G05F 3/205 |
| | | | 327/537 |
| 2010/0301819 A1 | 12/2010 | Wang | |
| 2014/0376138 A1* | 12/2014 | Kim | H02H 9/04 |
| | | | 361/86 |
| 2015/0185745 A1* | 7/2015 | Kim | G05F 1/465 |
| | | | 327/541 |
| 2016/0085249 A1* | 3/2016 | Lim | G11C 16/30 |
| | | | 365/185.18 |

* cited by examiner

VOLTAGE GENERATION APPARATUS

CROSS-REFERENCE TO RELATED APPLICATION

This application claims priority based upon Korean patent application No. 10-2014-0175970, filed on Dec. 9, 2014, the disclosure of which is hereby incorporated in its entirety by reference herein.

BACKGROUND

1. Technical Field

Various embodiments generally relate to a voltage generation apparatus, and more particularly to a voltage generation apparatus configured to include a voltage pump and a voltage regulator for generating an internal voltage.

2. Related Art

Electronic devices may include a voltage generation circuit configured to generate an internal voltage based on two or more external voltages. The voltage generation circuits can generate the internal voltage based on respective external voltages. If several voltage generation units generate one internal voltage, there may be needed at least two units for sensing the magnitude of internal voltage. However, a through-current flows among external voltages, resulting in the occurrence of unnecessary power consumption.

SUMMARY

According to an embodiment, there may be provided a voltage generation apparatus. The voltage generation apparatus may include an external voltage sensing circuit configured to generate a first start signal and a second start signal by sensing the magnitude of a first external voltage and the magnitude of a second external voltage. The voltage generation apparatus may include an internal voltage sensing circuit configured to generate a voltage generation signal by comparing an internal voltage with a target voltage. The voltage generation apparatus may include a voltage pumping circuit configured to be activated in response to the first start signal, configured to perform a pumping operation based on the voltage generation signal, and configured to generate the internal voltage. The voltage generation apparatus may include a voltage regulating circuit configured to be activated in response to the first and second start signals, and configured to generate the internal voltage based on the voltage generation signal.

DETAILED DESCRIPTION

Reference will now be made in detail to the embodiments, examples of which are illustrated in the accompanying drawings. Wherever possible, the same reference numbers will be used throughout the drawings to refer to the same or like parts.

In association with the embodiments, specific structural and functional descriptions are disclosed only for illustrative purposes, the embodiments can be implemented in various ways.

Various embodiments may be directed to providing a voltage generating apparatus that substantially obviates one or more problems due to limitations and disadvantages of the related art.

An embodiment may be directed to a voltage generation apparatus configured to detect a specific time at which each external voltage is normally applied when generating an internal voltage based on two or more external voltages, thereby stably generating the internal voltage.

An embodiment may be directed to a voltage generation apparatus configured to cut off a path of a leakage current passing through two or more external voltages when generating an internal voltage based on two or more external voltages, so that power loss may be minimized.

Figure 1:
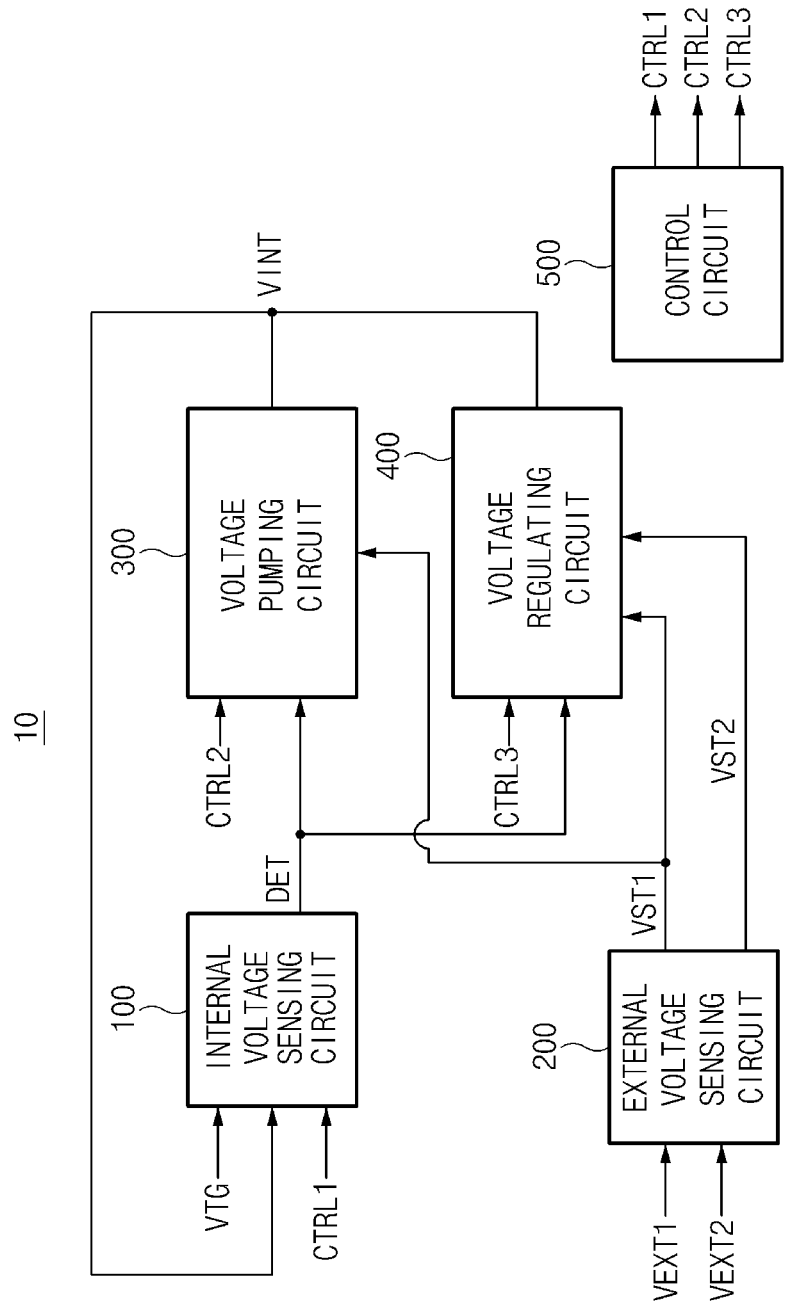
FIG. 1 is a block diagram illustrating a representation of an example of a voltage generation apparatus according to an embodiment.

FIG. 1 is a block diagram illustrating a representation of an example of a voltage generation apparatus according to an embodiment.

Referring to FIG. 1, the voltage generation apparatus 10 may include an internal voltage sensing circuit 100, an external voltage sensing circuit 200, and a voltage pumping circuit 300. The voltage generation apparatus 10 may include a voltage regulating circuit 400.

The internal voltage sensing circuit 100 may generate a voltage generation signal DET. The voltage generation signal DET may be generated by comparing a target voltage VTG with an internal voltage VINT generated from at least one of the voltage pumping circuit 300 and the voltage regulating circuit 400. The internal voltage sensing circuit 100 may activate the voltage generation signal DET when the internal voltage VINT does not reach the target voltage VTG level.

The voltage generation apparatus 10 may allow the voltage pumping circuit 300 and the voltage regulating circuit 400 to share the internal voltage sensing circuit 100. The voltage generation apparatus 10 may be configured to have the voltage pumping circuit 300 and the voltage regulating circuit 400 to both be coupled to the internal voltage sensing circuit 100. If the voltage generation apparatus 10 according to an embodiment shares the internal voltage sensing circuit 100, the size of the voltage generation apparatus 10 can be reduced as compared to the other embodiments in which the voltage pumping circuit 300 includes an additional internal voltage sensing unit and the voltage regulating circuit 400 includes an additional internal voltage sensing unit. The voltage pumping circuit 300 and the voltage regulating circuit 400 according to an embodiment may detect different internal voltages VINT so that the possibility of causing mismatching at the operation start timing can be reduced.

The external voltage sensing circuit 200 compares a first external voltage VEXT1 with a second external voltage VEXT2. The external voltage sensing circuit 200 generates a first start signal VST1 and a second start signal VST2 based on the comparing result between the first external voltage VEXT1 and the second external voltage VEXT2. The external voltage sensing circuit 200 may activate or deactivate the first start signal VST1 and the second start signal VST2 according to the magnitude of the first external voltage VEXT1 and the magnitude of the second external voltage VEXT2.

For example, the external voltage sensing circuit 200 may activate the first start signal VST1 when the first external voltage VEXT1 reaches a desired reference voltage and the second external voltage VEXT2 reaches a desired reference voltage.

However, the circuit for activating the first start signal VST1 contained in the external voltage sensing circuit 200 may be driven by a first external voltage VEXT1.

Therefore, the external voltage sensing circuit 200 may further generate the second start signal VST2 to not rely on the generation of the first start signal VST1.

A method for allowing the external voltage sensing circuit 200 to generate the first start signal VST1 and the second start signal VST2 will hereinafter be described with reference to FIGS. 2 to 5.

The voltage pumping circuit 300 may operate based on the voltage generation signal DET and the first start signal VST1. For example, the voltage pumping circuit 300 may be activated in response to the first start signal VST1, and may perform the pumping operation based on the voltage generation signal DET, so that the voltage pumping circuit 300 can generate the internal voltage VINT.

The voltage pumping circuit 300 may be driven based on the first external voltage VEXT1 to generate the internal voltage VINT. The pumping operation need not be performed when the first external voltage VEXT1 is abnormally provided.

The voltage pumping circuit 300 may perform the pumping operation when the internal voltage VINT does not reach a target voltage VTG in response to the voltage generation signal DET on the condition that the first external voltage VEXT1 and the second external voltage VEXT2 are normally applied in response to the first start signal VST1.

The voltage regulating circuit 400 may be activated in response to the first start signal VST1 and the second start signal VST2. The voltage regulating circuit 400 may linearly control the internal voltage VINT.

The voltage regulating circuit 400 may be driven based on the second external voltage VEXT2 to generate the internal voltage VINT. The voltage regulating operation need not be performed when the second external voltage VEXT2 is abnormally provided in the same manner as in the voltage pumping circuit 300.

For example, since the voltage regulating circuit 400 is driven based on the second external voltage VEXT2, there is a need to perform the regulating operation when the first external voltage VEXT1 and the second external voltage VEXT2 are normally applied. Accordingly, the voltage regulating circuit 400 may be activated in response to the first start signal VST1, and may also be activated in response to the second start signal VST2 for correctly detecting the example in which the second external voltage VEXT2 is abnormally applied.

A method for linearly generating the internal voltage VINT of the voltage regulating circuit 400 will hereinafter be described below. The voltage regulating circuit 400 may include a resistor coupled in series with a pass switch such as a MOS transistor. The MOS transistor may provide a path along which the second external voltage VEXT2 reaches the resistor, upon receiving the regulating activation signal REN illustrated in FIGS. 9 to 11 generated based on the voltage generation signal DET. According to gate-source voltage Vgs characteristics of the MOS transistor, whereas the relationship between the internal voltage VINT and the regulating activation signal REN is represented by a quadratic curve, the voltage regulating circuit 400 includes a resistor so that the voltage regulating circuit 400 can linearly control the internal voltage VINT.

A description of the voltage regulating circuit 400 will hereinafter be given with reference to FIGS. 9 to 11.

In accordance with an embodiment, the voltage generation apparatus 10 may include a control circuit 500. The control circuit 500 may be configured to generate control signals CTRL1, CTRL2, and CTRL3. The control signals CTRL1, CTRL2, and CTRL3 may be used to control the internal voltage sensing circuit 100, the voltage pumping circuit 300, and the voltage regulating circuit 400.

The control circuit 500 may control the internal voltage sensing circuit 100, the voltage pumping circuit 300, and the voltage regulating circuit 400. The control circuit 500 may be contained in a device such as, for example but not limited to, an external host, and may also be contained in the voltage generation apparatus 10 to generate a plurality of control signals CTRL1, CTRL2, and CTRL3.

Referring to FIG. 1, when the voltage generation apparatus 10 according to an embodiment includes the voltage pumping circuit 300 driven based on the first external voltage VEXT1 and the voltage regulating circuit 400 driven based on the second external voltage VEXT2 to generate the internal voltage VINT. When generating the internal voltage VINT, the voltage generation apparatus 100 is configured to perform the pumping operation or the regulating operation only when the first external voltage VEXT1 and the second external voltage VEXT2 normally reach a reference voltage, so that the voltage generation apparatus 100 may stably generate the internal voltage VINT.

Figure 2:
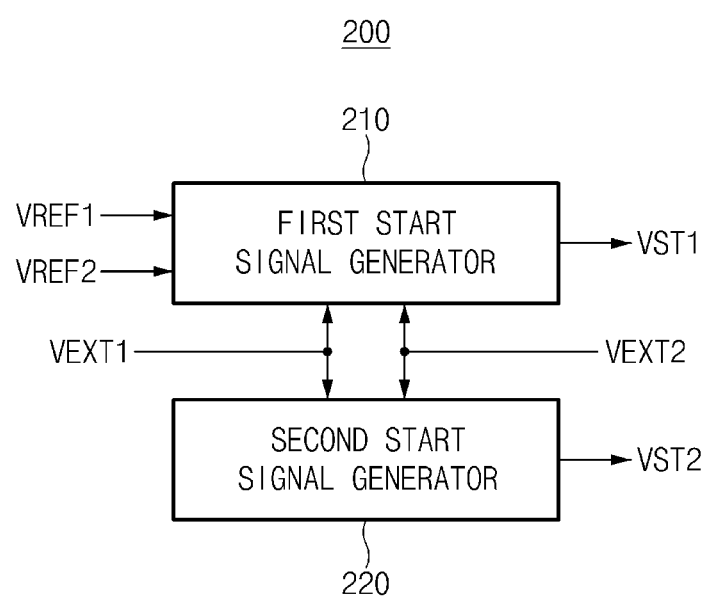
FIG. 2 is a block diagram illustrating a representation of an example of an external voltage sensing circuit according to an embodiment.

FIG. 2 is a block diagram illustrating a representation of an example of an external voltage sensing circuit according to an embodiment.

Referring to FIG. 2, the external voltage sensing circuit 200 may include a first start signal generator 210 and a second start signal generator 220.

The first start signal generator 210 may determine whether the first external voltage VEXT1 reaches a first reference voltage VREF1 and whether the second external voltage VEXT2 reaches a second reference voltage VREF2, so that the first start signal generator 210 may generate the first start signal VST1.

When each of the first external voltage VEXT1 and the second external voltage VEXT2 is equal to or higher than a threshold value, the second start signal generator 220 may activate the second start signal VST2.

Figure 3:
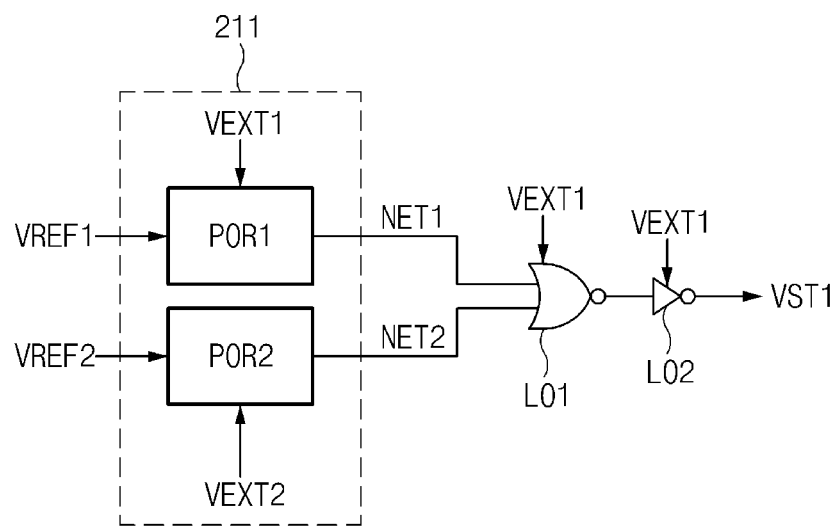
FIG. 3 is a circuit diagram illustrating a representation of an example of a first start signal generator according to an embodiment.
Figure 4A:
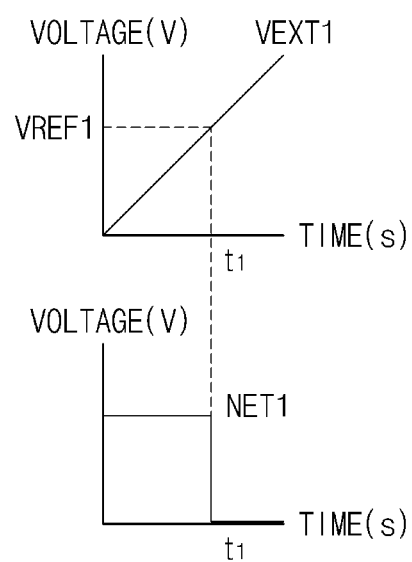
FIGS. 4A and 4B are time-voltage graphs illustrating representations of examples of operations of a power-on reset unit contained in the first start signal generator.
Figure 4B:
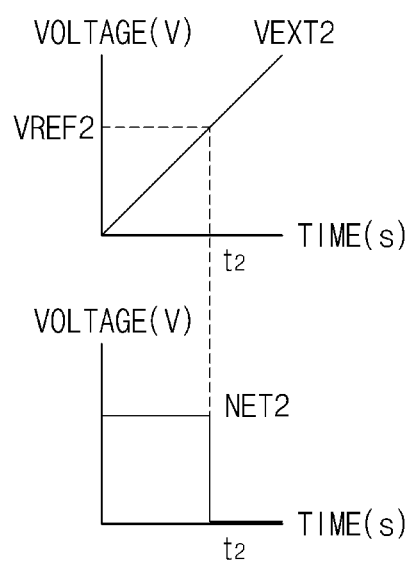

FIG. 3 is a circuit diagram illustrating a representation of an example of the first start signal generator according to an embodiment. FIGS. 4A and 4B are time-voltage graphs illustrating representations of examples of operations of a power-on reset unit contained in the first start signal generator.

Referring to FIG. 3, the first start signal generator 210 may include a power-on reset unit 211 and a plurality of logical operators LO1 and LO2.

The power-on reset unit 211 may initialize a first net signal NET1 when the first external voltage VEXT1 reaches the first reference voltage VREF1, and may initialize a second net signal NET2 when the second external voltage VEXT2 reaches the second reference voltage VREF2.

The power-on reset unit 211 may include a first power-on reset unit POR1 and a second power-on reset unit POR2. The first power-on reset unit POR1 may be driven based on the first external voltage VEXT1. When the first external voltage VEXT1 reaches the first reference voltage VREF1, the first power-on reset unit POR1 may generate the initialized first net signal NET1.

Referring now to FIG. 4A, to understand the operations of the first power-on reset unit POR1. In each graph illustrated in FIG. 4A, an X-axis may denote a time, and a Y-axis may denote the magnitude of voltage.

In FIG. 4A, the first power-on reset POR1 may initialize the first net signal NET1 at a specific time $t_1$ in response to the first external voltage VEXT1.

The second power-on reset unit POR2 may initialize the second net signal NET2 when the second external voltage VEXT2 reaches the second reference voltage VREF2.

Referring to FIG. 4B, the second power-on reset unit POR2 may initialize the second net signal NET2 at a specific time $t_2$ at which the second external voltage VEXT2 reaches the second reference voltage VREF2.

The logical operators LO1 and LO2 configured to perform a logic operation of the first net signal NET1 and the second net signal NET2 may be a NOR operator LO1 and an inverter LO2, respectively. Since the operation units LO1 and LO2 perform a logic OR operation, the operation units LO1 and LO2 may provide an activated first start signal VST1 when at least one of the first net signal NET1 and the second net signal NET2 is activated.

The first start signal generator 210 may detect the example in which the first external voltage VEXT1 and the second external voltage VEXT2 are equal to or higher than a first reference voltage VREF1 and a second reference voltage VREF2, respectively. When the logic operation is performed as described above, the first start signal VST1 may correspond to a logic low state when the first external voltage VEXT1 is equal to or higher than the first reference voltage VREF1 and the second external voltage VEXT2 is equal to or higher than the second reference voltage VREF2.

The logical operators LO1 and LO2 may be driven based on the first external voltage VEXT1. When the first external voltage VEXT1 is not provided irrespective of the output signal of the power-on reset unit 211, the first start signal VST1 may also correspond to a logic low state.

If the first external voltage VEXT1 is not provided, it may be impossible to operate all the circuits driven based on the first external voltage VEXT1. For example, the first start signal VST1 corresponds to a logic low state when the first external voltage VEXT1 is not provided. Although the first start signal VST1 has the same value as in the example in which the first start signal VST1 is normally provided, no problems may occur. For example, the voltage pumping circuit 300 driven by the first external voltage VEXT1 may be activated in the example in which the first start signal VST1 is at a logic low state. Assuming that the first start signal VST1 is at a logic low state, this means that the first external voltage VEXT1 and the second external voltage VEXT2 are normally applied. However, although the voltage pumping circuit 300 is activated because the first start signal VST1 is at a logic low state even when the first external voltage VEXT1 is not applied, the first external voltage VEXT1 capable of driving the voltage pumping circuit 300 is not provided so that the voltage pumping circuit 300 does not operate. Accordingly, the voltage pumping circuit 300 may not malfunction.

However, the circuits driven by the second external voltage VEXT2 can be operated even when the first external voltage VEXT1 is abnormally provided. Thus, if the circuits were configured based on only the first start signal VST1, the circuits may potentially malfunction. Therefore, in order to prevent the occurrence of such malfunction, the external voltage sensing circuit 200 may include a second start signal generator 220.

Figure 5:
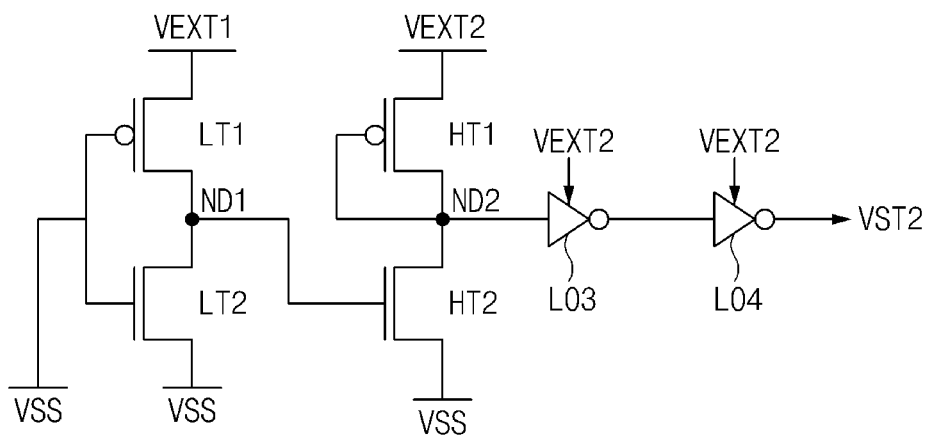
FIG. 5 is a circuit diagram illustrating a representation of an example of a second start signal generator according to an embodiment.

FIG. 5 is a circuit diagram illustrating a representation of an example of a second start signal generator according to an embodiment.

Referring to FIG. 5, the second start signal generator 220 may include a plurality of transistors LT1, LT2, HT1 and HT2 and a plurality of logical operators LO3 and LO4.

A first low transistor LT1 and a second low transistor LT2 may be coupled in series between the first external voltage VEXT1 and a ground voltage VSS. For example, the first external voltage VEXT1 may correspond to an external low voltage VDDL, and the second external voltage VEXT2 may correspond to an external high voltage VDDH.

In this example, it may be understood that each of the first low transistor LT1 and the second low transistor LT2 is a low-voltage transistor that is capable of being operated based on a relatively-low first external voltage VEXT1.

The low transistor LT1 may be a PMOS transistor. The low transistor LT1 may include a first terminal coupled to the first external voltage VEXT1, a gate terminal receiving a ground voltage VSS, and a second terminal coupled to a first node ND1. The second low transistor LT2 may be an NMOS transistor. The second low transistor LT2 may include a first terminal coupled to a ground voltage VSS terminal, a gate terminal receiving the ground voltage VSS, and a second terminal coupled to the first node ND1.

The first low transistor LT1 and the second low transistor LT2 may be operated in substantially the same manner as in the inverter driven by the first external voltage VEXT1, so that the first external voltage VEXT1 is applied to the first node ND1.

A first high transistor HT1 and a second high transistor HT2 may be coupled in series between the second external voltage VEXT2 and the ground voltage VSS.

It may be understood that each of the first high transistor HT1 and the second high transistor HT2 is a high-voltage transistor that is capable of being operated based on a relatively-high second external voltage VEXT2. For example, a threshold voltage of the first high transistor HT1 may be lower than a threshold voltage of the first low transistor LT1. For example, threshold voltage of the second high transistor HT2 may be higher than a threshold voltage of the second low transistor LT2.

The first high transistor HT1 may correspond to a PMOS transistor. The first high transistor HT1 may include a first terminal coupled to a second external voltage VEXT2, and may also include a gate terminal and a second terminal commonly coupled to a second node ND2.

The first high transistor HT1 may be turned on when the second external voltage VEXT2 is higher than a threshold voltage of the first high transistor HT1.

The second high transistor HT2 may include a NMOS transistor. The second high transistor HT2 may include a first terminal coupled to a ground voltage VSS, a gate terminal coupled to the first node ND1, and a second terminal coupled to the second node ND2.

The second high transistor HT2 may be turned on when the first external voltage VEXT1 is higher than a threshold voltage of the second high transistor HT2.

The voltage applied to the second node ND2 is provided as a second start signal VST2 after passing through the logical operators LO3 and LO4 driven by the second external voltage VEXT2. It may be understood that a value corresponding to a logic state of the second node ND2 voltage is shifted to a level of the second external voltage VEXT2 so that the corresponding value is provided as the second start signal VST2.

For example, a logic state of the second node ND2 may correspond to a logic state of the second start signal VST2, or vice versa. A logic state to be assigned to the second node ND2 voltage according to the first external voltage VEXT1 and the second external voltage VEXT2 will hereinafter be described below.

If the first external voltage VEXT1 is less than a threshold voltage of the second high transistor HT2 and the second external voltage VEXT2 is less than a threshold voltage of the first high transistor HT1, the first high transistor HT1 and the second high transistor HT2 may be turned off. Since the second external voltage VEXT2 is less than a threshold voltage of the first high transistor HT1, the logical operators LO3 and LO4 are not driven, so that the second start signal VST2 may correspond to a logic low state.

If the first external voltage VEXT1 is less than a threshold voltage of the second high transistor HT2 and the second external voltage VEXT2 is higher than a threshold voltage of the first high transistor HT1, the first high transistor HT1 is turned off and the second high transistor HT2 is turned on. Therefore, the second external voltage VEXT2 is applied to the second node ND2, and the second start signal VST2 may correspond to a logic high state.

In order to prevent the occurrence of a malfunction caused by the first start signal VST1 generated from the first start signal generator 210 illustrated in FIGS. 3 and 4, the second start signal generator 220 can detect an example in which only the second external voltage VEXT2 is provided on the condition that the first external voltage VEXT2 is abnormally provided. Therefore, the above-mentioned example may indicate that the second start signal VST2 is at a logic high state.

If the first external voltage VEXT1 is higher than a threshold voltage of the second high transistor HT2 and the second external voltage VEXT2 is less than a threshold voltage of the first high transistor HT1, the first high transistor HT1 may be turned on and the second high transistor HT2 may be turned off. The ground voltage VSS is applied to the second node ND2, so that the second start signal VST2 may correspond to a logic low state.

In the example in which the first external voltage VEXT1 is higher than a threshold voltage of the second high transistor HT2 and the second external voltage VEXT2 is higher than a threshold voltage of the first high transistor HT1, the first high transistor HT1 and the second high transistor HT2 are turned on. In this example, the first high transistor HT1 and the second high transistor HT2 are in conflict, so that the second start signal VST2 may correspond to a logic low state.

Therefore, if the second start signal VST2 is at a logic high state, the first external voltage VEXT1 is abnormally provided and the second external voltage VEXT2 is normally provided. Therefore, although the first start signal VST2 is at a logic low state because the first external voltage VEXT1 is not provided, the voltage regulating circuit 400 can be operated only when the second external voltage VEXT2 is normally provided through the second start signal VST2.

Figure 6:
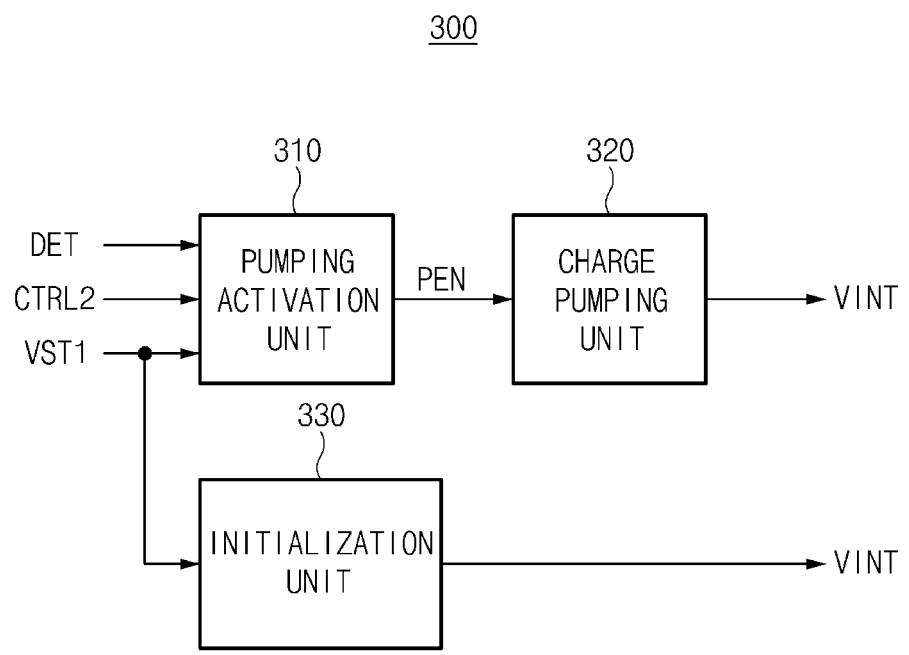
FIG. 6 is a block diagram illustrating a representation of an example of a voltage pumping circuit illustrated in FIG. 1.

FIG. 6 is a block diagram illustrating a representation of an example of a voltage pumping circuit illustrated in FIG. 1.

Referring to FIG. 6, the voltage pumping circuit 300 may include a pumping activation unit 310, a charge pumping unit 320, and an initialization unit 330.

The pumping activation unit 310 may perform a logic operation between the first start signal VST1 and the voltage generation signal DET, and may generate a pumping activation signal PEN.

The above-mentioned example in which the first start signal VST1 is at a logic low state may indicate that the first external voltage VEXT1 is normally provided. As described above, the first start signal VST1 is at a logic low state even when the first external voltage VEXT1 is not provided. However, it may be impossible to operate the voltage pumping circuit 300 operated based on the first external voltage VEXT1, and as such a detailed description thereof will hereinafter be omitted. Accordingly, the pumping activation unit 310 activates a pumping activation signal PEN when the first start signal VST1 is at a logic low state and the voltage generation signal DET is activated, so that the charge pumping unit 320 may generate the internal voltage VINT by performing the charge pumping operation.

In accordance with an embodiment, the pumping activation unit 310 receives a second control signal CTRL2 from a control circuit 500 illustrated in FIG. 1 to control activation or deactivation.

The charge pumping unit 320 may include a capacitor and a switch, and may perform the charge pumping operation in response to the pumping activation signal PEN. The charge pumping unit 320 may be similar in structure to a conventional charge pump, and as such a detailed description thereof will hereinafter be omitted for convenience of description.

Figure 8:
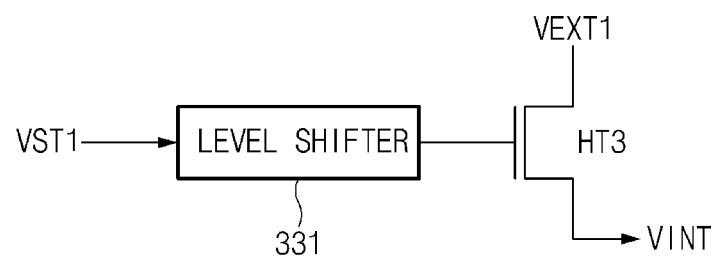
FIG. 8 is a block diagram illustrating a representation of an example of an initialization unit contained in the pumping activation unit illustrated in FIG. 6.

If at least one of the first external voltage VEXT1 and the second external voltage VEXT2 is abnormally applied to the voltage generation apparatus 10, i.e., if the first start signal VST1 is at a logic high state, the initialization unit 330 provides the first external voltage VEXT1 as the internal voltage VINT, and thus initializes the internal voltage VINT (see FIG. 8).

Since the internal voltage VINT is initialized by the initialization unit 330, the internal voltage VINT increased by the pumping operation or the voltage regulating operation can be initialized when the external power-supply voltage is abnormally provided.

Figure 7:
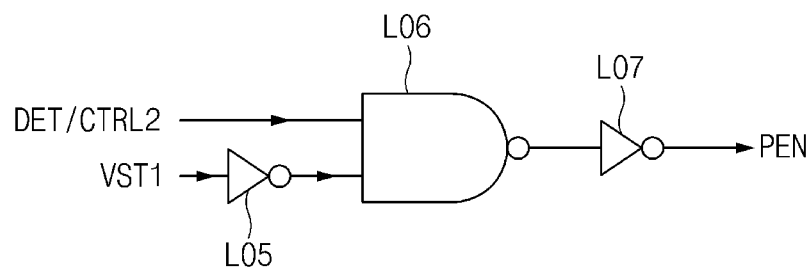
FIG. 7 is a circuit diagram illustrating a representation of an example of a pumping activation unit illustrated in FIG. 6.

FIG. 7 is a circuit diagram illustrating a representation of an example of the pumping activation unit illustrated in FIG. 6.

Referring to FIG. 7, the pumping activation unit 310 may include the fifth to seventh logical operators LO5, LO6, and LO7.

The fifth logical operator LO5 may be an inverter. The fifth logical operator LO5 may invert the first start signal VST1 and may provide the inverted first start signal VST1 to the sixth logical operator LO6.

The sixth logical operator LO6 may be a NAND operator, and may perform a NAND operation with the inverted first start signal VST1 and at least one of the voltage generation signal DET and the second control signal CTRL2.

The seventh logical operator LO7 may be an inverter. The seventh logical operator LO7 may invert the output signal of the sixth logical operator LO6 and provide the inverted output signal as the pumping activation signal PEN.

In the same manner as in FIG. 6, the pumping activation unit 310 may activate the pumping activation signal PEN only when the first start signal VST1 is at a logic low state and the voltage generation signal DET is activated. According to an embodiment, the pumping activation unit 310 may also activate the pumping activation signal PEN only when the voltage generation signal DET and the second control signal CTRL2 are activated.

FIG. 8 is a block diagram illustrating a representation of an example of an example of the initialization unit contained in the pumping activation unit illustrated in FIG. 6.

Referring to FIG. 8, the initialization unit 330 may include a level shifter 331 and a third high transistor HT3.

As described above in an embodiment, the first start signal VST1 may be driven by the first external voltage VEXT1. The example in which the first start signal VST1 is at a logic high state may be identical to the other example in which the first start signal VST1 has the same value as the first external voltage VEXT1.

Therefore, the level shifter 331 is based on the first external voltage VEXT1 and the second external voltage VEXT2, so that the level shifter 331 may increase a voltage level of the first start signal VST1 corresponding to a logic high state to the second external voltage VEXT2.

If the first start signal VST1 is at a logic high state, the third high transistor HT3 receives a voltage corresponding to the second external voltage VEXT2, and provides the first external voltage VEXT1 as the internal voltage VINT.

Referring to FIGS. 3, 4A and 4B, if the first start signal VST1 is at a logic high state, this means that at least one of the first external voltage VEXT1 and the second external voltage VEXT2 is abnormally applied. If at least one of two external voltages VEXT1, VEXT2 is abnormally applied, the initialization unit 330 may initialize the internal voltage VINT to prevent the internal voltage VINT from being abnormally increased.

Figure 9:
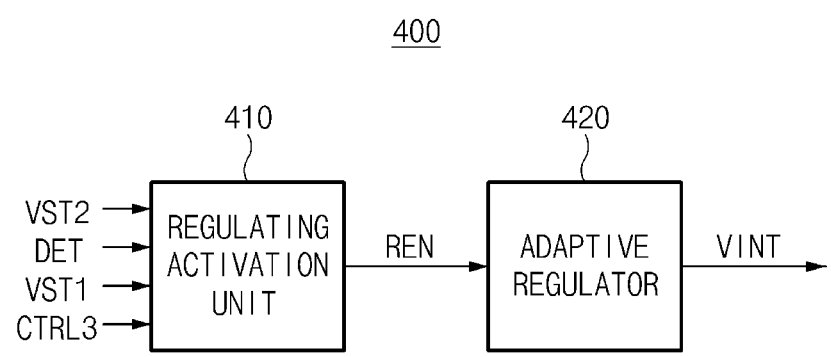
FIG. 9 is a block diagram illustrating a representation of an example of a voltage regulating circuit according to an embodiment.

FIG. 9 is a block diagram illustrating a representation of an example of a voltage regulating circuit according to an embodiment.

Referring to FIG. 9, the voltage regulating circuit 400 may include a regulating activation unit 410 and an adaptive regulator 420.

The regulating activation unit 410 may be activated in response to the voltage generation signal DET. The regulating activation unit 410 may perform a logic operation between the first start signal VST1 and the second start signal VST2, and may generate the regulating activation signal REN.

The regulating activation unit 410 may reflect the results obtained when the first start signal generator 210 and the second start signal generator 220 detect the normal application states of the first external voltage VEXT1 and the second external voltage VEXT2, so that the regulating activation unit 410 may generate the regulating activation signal REN.

The first start signal VST1 generated from the first start signal generator 210 may be at a logic high state when at least one of the first external voltage VEXT1 and the second external voltage VEXT2 is abnormally applied. However, the first start signal generator 210 is driven by the first external voltage VEXT1. If the first external voltage VEXT1 is abnormally applied, the first start signal VST1 may be at a logic low state irrespective of the second external voltage VEXT2 value.

In order to address the above-mentioned issues, the first start signal generator 220 detects the example in which the first external voltage VEXT1 is less than a threshold voltage of a high transistor and the second external voltage VEXT2 is higher than the threshold voltage of the high transistor, so that the first start signal generator 220 generates the second start signal VST2.

The regulating activation unit 410 may activate the pumping activation signal PEN only when there is a need to boost the internal voltage VINT in response to the voltage generation signal DET although the first external voltage VEXT1 and the second external voltage VEXT2 are normally applied based on the first start signal VST1 and the second start signal VST2.

The adaptive regulator 420 may linearly provide the internal voltage VINT in response to the regulating activation signal REN. A method for allowing the adaptive regulator 420 to provide the internal voltage VINT will hereinafter be described with reference to FIG. 11.

Figure 10:
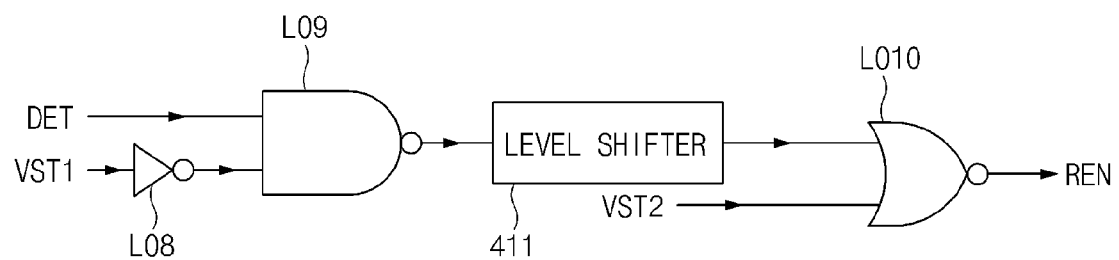
FIG. 10 is a circuit diagram illustrating a representation of an example of a regulator activation unit illustrated in FIG. 9.

FIG. 10 is a circuit diagram illustrating a representation of an example of the regulator activation unit illustrated in FIG. 9.

Referring to FIG. 10, the regulating activation unit 410 may include the $8^{th}$ to $10^{th}$ logical operators LO8, LO9, and LO10 and the level shifter 411.

The $8^{th}$ logical operator LO8 may be an inverter, so that the $8^{th}$ logical operator LO8 inverts the first start signal VST1 and provides the inverted first start signal VST1 to the $9^{th}$ logical operator LO9. The $9^{th}$ logical operator LO9 may perform a NAND operation with the inverted first start signal VST1 and the voltage generation signal DET, and may provide the NAND operation result to the level shifter 411.

The level shifter 411 may boost a voltage level of the output signal of the $9^{th}$ logical operator LO9 to a level of the second external voltage VEXT2, and may provide the boosted result to the $10^{th}$ logical operator LO10.

The $10^{th}$ logical operator LO10 may perform a NOR operation with the output signal of the level shifter 411 and the second start signal VST2, and may provide the NOR operation result as the regulating activation signal REN.

Through the above-mentioned operation processing, the regulating activation signal REN is activated only when the first start signal VST1 is at a logic low state and the second start signal VST2 is at a logic high state, so that the voltage regulation operation can be performed.

Figure 11:
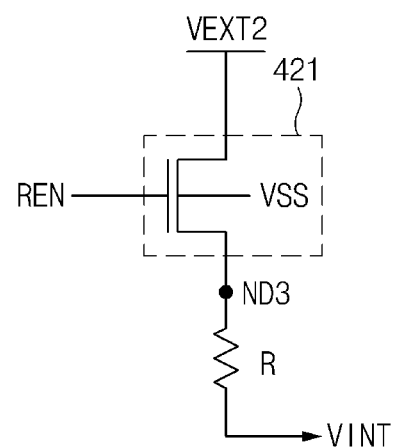
FIG. 11 is a circuit diagram illustrating a representation of an example of an adaptive regulator according to an embodiment.

FIG. 11 is a circuit diagram illustrating a representation of an example of the adaptive regulator according to an embodiment.

Referring to FIG. 11, the adaptive regulator 420 may include a pass switching unit 421 and a resistor unit R.

Although one pass switching unit 421 and one resistor unit R are illustrated in FIG. 11 for convenience of description, the embodiments are not limited thereto, and a plurality of adaptive regulators 420 may also be used as necessary. In this example, a separate control signal for activating each adaptive regulator 420 may be provided through the control circuit 500 of FIG. 1.

The control signal provided from the control circuit 500 may be contained in a third control signal CTRL3 of FIG. 1, and may be implemented to control each adaptive regulator 420 through a logic operation with the regulating activation signal REN.

For convenience of description and better understanding of the embodiments, a detailed description of a single adaptive regulator 420 will hereinafter be given below.

Referring to FIG. 11, the pass switching unit 421 may include an NMOS transistor. The NMOS transistor may include a first terminal coupled to a third node ND3, a gate terminal receiving the regulating activation signal REN, and a second terminal coupled to the second external voltage VEXT2. The NMOS transistor may include a body receiving the ground voltage VSS.

The pass switching unit 421 may perform connection of the path through which the second external voltage VEXT2 is provided as the internal voltage VINT in response to the regulating activation signal REN. For example, the path between the third node ND3 and the second external voltage VEXT2 may be electrically connected by the pass switching unit 421.

In this example, the magnitude of a current flowing from the pass switching unit 421 to the resistor unit R may be determined according to the magnitude of a voltage between the gate terminal of the pass switching unit 421 and the first terminal and the magnitude of a gate-source voltage for use in the NMOS transistor. Generally, the magnitude of a current flowing in the pass switching unit 421 in response to the gate-source voltage may not linearly increase, and may curvedly increase. In other words, the magnitude of a current may be abruptly increased according to the magnitude of a gate-source voltage. In this example, it may be difficult to control the internal voltage VINT.

However, the adaptive regulator 420 according to an embodiment includes the resistor unit R so that the adaptive regulator 420 may linearly provide the internal voltage VINT. The current decided in response to the magnitude of a gate-source voltage may also flow in the resistor unit R.

If the internal voltage VINT is reduced, the gate-source voltage increases so that the magnitude of a current flowing in the resistor unit R may abruptly increase. The driving capability of the pass switching unit 421 increases in response to the increasing current, so that the internal voltage VINT may unavoidably increase. However, if the internal voltage VINT increases, the voltage drop generated by the resistor unit R unavoidably increases, so that the magnitude of the internal voltage VINT is reduced again.

For example, the magnitude of the internal voltage VINT may be linearly controlled due to the increasing driving capability of the pass switching unit 421 and the voltage drop caused by the resistor unit R. The adaptive regulator 420 may prevent the current from being increased in proportion to the second external voltage VEXT2 and a square root of the internal voltage VINT, and may control the current to be increased primarily in proportion to the second external voltage VEXT2 and the internal voltage VINT.

The ground voltage VSS is applied to the body contained in the pass switching unit 421, so that a leakage current can be minimized when the pass switching unit 421 does not operate.

The adaptive regulator 420 linearly provides the internal voltage VINT even when the second external voltage VEXT2 is provided in response to the regulating activation signal REN, so that the internal voltage VINT can be stably generated.

The voltage generation apparatus 10 according to an embodiment may include the voltage pumping circuit 300 and the voltage regulating circuit 400 that may be driven based on two or more external voltages, so that the voltage generation apparatus 10 can adaptively generate the internal voltage. In the example of using two or more external voltages, the voltage generation apparatus 10 can distribute the use of a current of an external voltage.

The voltage generation apparatus 10 according to an embodiment may share the internal voltage sensing circuit 100, and thus the voltage generation signal DET is applied to each of the voltage pumping circuit 300 and the voltage regulating circuit 400, so that there is a lower probability of causing mismatching between a plurality of circuits.

Moreover, the voltage generation apparatus 10 according to an embodiment may include the external voltage sensing circuit 200 to remove a leakage current capable of being generated when two or more external voltages are used, so that the voltage generation apparatus can control the operation activation of the voltage pumping circuit 300 and the voltage regulating circuit 400.

The voltage generation apparatus according to the various embodiments is configured to perform the pumping operation and the regulating operation, so that the voltage generation apparatus may stably generate the internal voltage.

The voltage generation apparatus according to the various embodiments may drive the voltage pumping circuit and the voltage regulating circuit using two or more external voltages, may improve the capability of generating the internal voltage, and may cut off a leakage current capable of being generated through the two operation circuits, so that power consumption can be minimized and the voltage can be efficiently generated.

Figure 12:
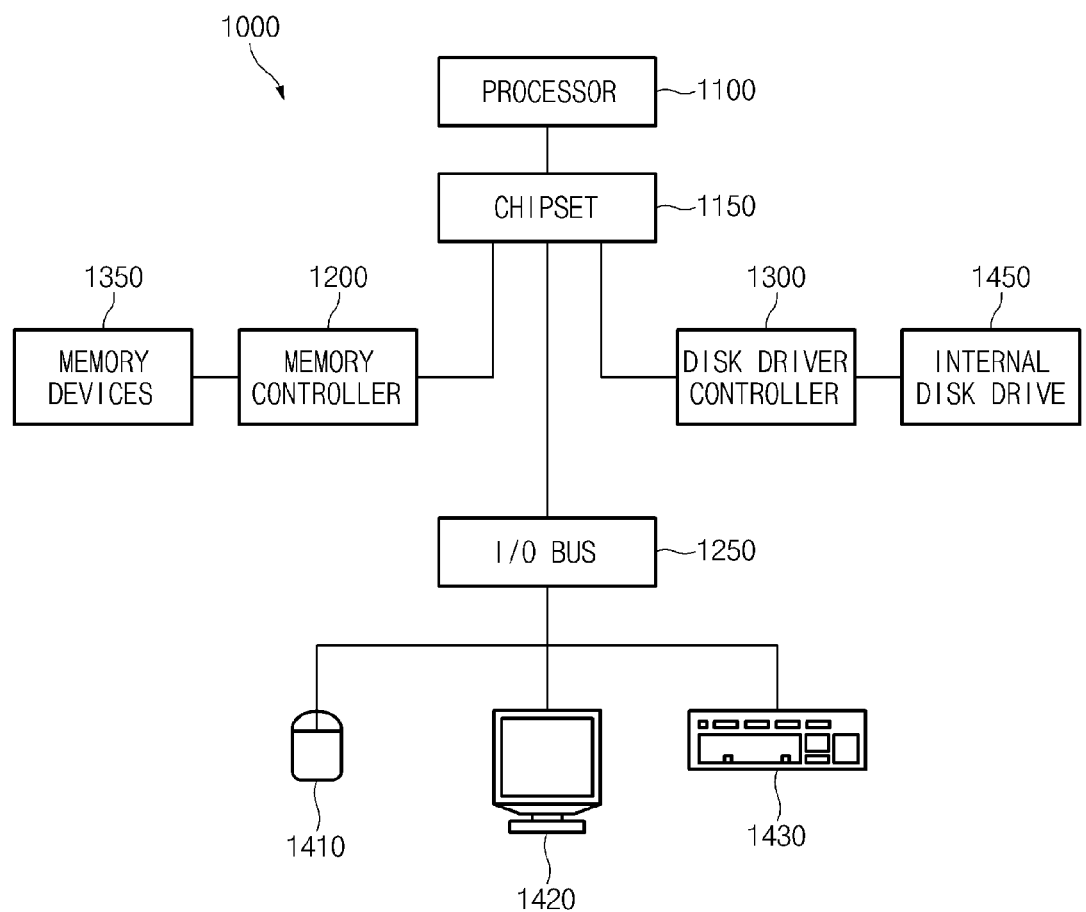
FIG. 12 illustrates a block diagram of an example of a representation of a system employing a voltage generation apparatus in accordance with the various embodiments discussed above with relation to FIGS. 1-11.

The voltage generation apparatus discussed above (see FIGS. 1-11) are particular useful in the design of memory devices, processors, and computer systems. For example, referring to FIG. 12, a block diagram of a system employing the voltage generation apparatus in accordance with the various embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one voltage generation apparatus as discussed above with reference to FIGS. 1-11. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one voltage generation apparatus as discussed above with relation to FIGS. 1-11, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 12 is merely one example of a system employing the voltage generation apparatus as discussed above with relation to FIGS. 1-11. In alternate embodiments, such as cellular phones or digital cameras, the components may differ from the embodiments illustrated in FIG. 12.

Those skilled in the art will appreciate that the embodiments may be carried out in other specific ways than those set forth herein without departing from the spirit and essential characteristics of the application. The above examples of embodiments are therefore to be construed in all aspects as illustrative and not restrictive.

Numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A voltage generation apparatus comprising:
    an external voltage sensing circuit configured to generate a first start signal and a second start signal by sensing the magnitude of a first external voltage and a magnitude of a second external voltage;
    an internal voltage sensing circuit configured to generate a voltage generation signal by comparing an internal voltage with a target voltage;
    a voltage pumping circuit configured to be activated in response to the first start signal, configured to perform a pumping operation based on the voltage generation signal, and configured to generate the internal voltage; and
    a voltage regulating circuit configured to be activated in response to the first and second start signals, and configured to generate the internal voltage based on the voltage generation signal.

2. The voltage generation apparatus according to claim 1, wherein the external voltage sensing circuit includes:
    a first start signal generator configured to determine whether the first external voltage reaches a first reference voltage and the second external voltage reaches a second reference voltage, and configured to generate the first start signal; and
    a second start signal generator configured to activate the second start signal when the first external voltage is less than a first threshold voltage and the second external voltage is greater than a second threshold voltage.

3. The voltage generation apparatus according to claim 2, wherein the voltage regulating circuit includes:
    a regulating activation unit configured to be activated in response to the voltage generation signal, configured to perform a logic operation with the first start signal and the second start signal, and configured to generate a regulating activation signal; and
    an adaptive regulator configured to linearly provide the internal voltage in response to the regulating activation signal.

4. The voltage generation apparatus according to claim 3, wherein the adaptive regulator includes:
    a pass switching unit configured to provide the second external voltage as the internal voltage, upon receiving the regulating activation signal; and
    a resistor unit having one end coupled to the pass switching unit and another end configured for providing the internal voltage.

5. The voltage generation apparatus according to claim 4, wherein the pass switching unit includes an NMOS transistor, and
    wherein the NMOS transistor includes a first terminal coupled to the one end of the resistor unit, a second terminal configured for receiving the second external voltage, and a body configured for receiving a ground voltage as an input.

6. The voltage generation apparatus according to claim 5, wherein the NMOS transistor includes a gate configured for receiving the regulating activation signal.

7. The voltage generation apparatus according to claim 4, wherein the adaptive regulator includes at least two or more of the pass switching units, and at least two or more of the resistor units, and
    wherein each adaptive regulator is coupled to a resistor unit, respectively,
    the voltage generation apparatus further comprising:
    a control circuit configured to activate each pass switching unit and each resistor unit.

8. The voltage generation apparatus according to claim 3, wherein the internal voltage sensing circuit and the voltage pumping circuit are driven based on the first external voltage, and the voltage regulating circuit is driven based on the second external voltage.

9. The voltage generation apparatus according to claim 8, wherein the regulating activation unit further includes:
   a level shifter configured to increase a voltage level of the voltage generation signal.

10. The voltage generation apparatus according to claim 8, wherein the regulating activation unit further includes:
   an inverter configured to receive the first start signal;
   a NAND gate configured to receive an output of the inverter and the voltage generation signal;
   a level shifter configured to receive an output of the NAND gate and boost a level of the output of the NAND gate to a level of the second external voltage; and
   a NOR gate configured to receive an output of the level shifter and the second start signal, and output the regulating activation signal.

11. The voltage generation apparatus according to claim 2, wherein the first start signal generator includes:
   a power-on reset unit configured to initialize a first net signal when the first external voltage reaches the first reference voltage, and to initialize the second net signal when the second external voltage reaches the second reference voltage; and
   a logical operator configured to activate the first start signal when at least one of the first net signal and the second net signal is activated.

12. The voltage generation apparatus according to claim 3, wherein the voltage pumping circuit includes:
   a pumping activation unit configured to perform a logic operation between the first start signal and the voltage generation signal to generate a pumping activation signal;
   a charge pumping unit configured to generate the internal voltage by performing a charge pumping operation in response to the pumping activation signal; and
   an initialization unit configured to provide the first external voltage as the internal voltage in response to the first start signal.

13. The voltage generation apparatus according to claim 3, wherein the pumping activation unit includes:
   an inverter configured to receive the first start signal;
   a NAND gate configured to receive the voltage generation signal or the second control signal, and the output of the inverter; and
   another inverter configured to receive the output of the NAND gate and output the pumping activation signal.

14. The voltage generation apparatus according to claim 12, wherein:
   the pumping activation unit activates the pumping activation signal when the first start signal corresponds to a first state and the activation signal is activated, and
   the initialization unit provides the first external voltage as the internal voltage when the first start signal corresponds to a second state different from the first state.

15. The voltage generation apparatus according to claim 1, wherein the first external voltage corresponds to an external low voltage, and the second external voltage corresponds to an external high voltage.

16. The voltage generation apparatus according to claim 15, wherein the second external voltage is greater than the first external voltage.

* * * * *